United States Patent [19]
Olenick et al.

[11] Patent Number: 5,041,695
[45] Date of Patent: Aug. 20, 1991

[54] CO-FIRED CERAMIC PACKAGE FOR A POWER CIRCUIT

[75] Inventors: John A. Olenick; Allen B. Timberlake, both of Columbia, Md.

[73] Assignee: Westinghouse Electric Corp., Pittsburgh, Pa.

[21] Appl. No.: 360,071

[22] Filed: Jun. 1, 1989

[51] Int. Cl.⁵ .......................... H01L 23/02; H05K 5/06
[52] U.S. Cl. ................................ 174/52.4; 174/17.05; 174/17 GF; 357/74
[58] Field of Search ............... 174/52.4, 52.3, 52.1, 174/52.2, 17.05, 17 GF, 25 G, 26 G; 357/74, 75, 76; 29/592.1

[56] References Cited

U.S. PATENT DOCUMENTS

| | | | |
|---|---|---|---|
| 3,735,211 | 5/1973 | Kapnias | 357/80 |
| 3,899,720 | 8/1975 | Peterson | 317/101 D |
| 3,984,620 | 10/1976 | Robillard et al. | 174/52.4 |
| 4,336,088 | 6/1982 | Hetherington et al. | |
| 4,413,061 | 11/1983 | Kumar et al. | |
| 4,434,134 | 2/1984 | Darrow et al. | |
| 4,457,950 | 7/1984 | Fujita et al. | |
| 4,504,339 | 3/1985 | Kamehara et al. | |
| 4,645,552 | 2/1987 | Vitriol et al. | |
| 4,663,649 | 5/1987 | Suzuki et al. | 357/67 |
| 4,831,212 | 5/1989 | Ogata et al. | 174/52.4 |
| 4,868,712 | 9/1989 | Woodman | 361/388 |

Primary Examiner—Leo P. Picard
Assistant Examiner—Bot Lee Ledynh
Attorney, Agent, or Firm—W. G. Sutcliff

[57] ABSTRACT

Both a co-fired ceramic package for a power circuit is disclosed as well as a method of manufacture thereof. The package includes a base which is formed from a plurality of pyrolizable ceramic films, each of which includes a heat-conductive and electrically insulative ceramic material such as aluminum nitride, silicon carbide or beryllium oxide embedded within a binder. In the method of the invention, two or three ceramic films are metalized with a pattern of conductive material on their top surfaces. The resulting metalized films are then stacked over a plurality of unmetalized ceramic films, and the resulting aggregate stack is laminated together by the application of heat and pressure. Electrical components are then soldered onto the top surface of the base, and a cover is sealingly connected around the resulting hybrid circuit. The metalization step advantageously forms terminals around the cover which allow access to the heat generating power circuit without the need for glass post seals. The resulting, integrated ceramic structure is free of internal thermal stresses, and affords better heat dissipation characteristics than prior art devices.

7 Claims, 4 Drawing Sheets

CO-FIRED CERAMIC PACKAGE FOR A POWER CIRCUIT

BACKGROUND OF THE INVENTION

This invention generally relates to packages for power circuits, and is specifically concerned with a co-fired ceramic package that is heat conductive but electrically insulative.

Packages for hermetically sealing power hybrid circuits are known in the prior art. Such packages are typically used in airborne radar system to protect delicate, heat generating power circuits from thermal overload and mechanical shock. Such packages include a housing formed from a heat conductive metal such as copper or a copper alloy that has been gold-plated. The gold-plated base of the housing receives one or more ceramic substrates. Each substrate includes a network of conductive members on its top surface, and an array of discrete electronic components and chips are soldered on to various junctions of the conductor network to complete the circuit. The bottom of the substrate is in turn mechanically and thermally connected to the base of the housing by indium-lead solders. A plurality of terminal posts provide access to the power circuit disposed on the substrates. These posts pass through the walls of the metallic housing, and terminate in thin lead wires which are in turn soldered onto various junctions within the circuit. To prevent the terminal posts from contacting the metallic housing and short circuiting, each post is mounted by way of a glass post seal. To hermetically seal the circuit from the ambient atmosphere, the housing is filled with an inert gas such as nitrogen, and a metallic cover (which again may be copper or a copper alloy) is sealingly braised or soldered around the upper edge of the housing.

While such prior art hermetic packages are generally capable of protecting delicate, miniaturized hybrid power circuits from mechanical shock and thermal overload, the applicants have noted a number of areas where the performance of these packages could be improved. For example, the applicants have noted that the heat dissipating abilities of such packages is hindered by the ceramic-to-metal interfaces between the bottom surface of each ceramic substrate and the base of the housing to which this bottom surface is soldered. The applicants have also noted that the indium used in the ceramic-to-metal interfacing solders tends to form a gold-indium intermetallic compound with the gold plating on the housing which is very brittle. This brittleness, coupled with the stress generated by differential thermal expansion between the ceramic substrates and the base of the metallic housing could cause breakage of the solder bond that secures the substrate, thereby detaching the substrate from the base both mechanically and thermally, and subjecting the wire leads within the housing to relatively high levels of stress. Further, the applicants have noted that the glass post seals that insulatively mount the terminal posts through the walls of the housing are difficult to manufacture, and are one of the areas of the package most apt to mechanical failure. Such failure can break the hermetic seal of the package, and may even cause short-circuiting to occur between the various terminal posts of the circuit.

Clearly, a hermetic package for miniaturized hybrid power circuits is needed which offers improved performance over prior art packages in the areas of thermal conductivity, and mechanical and electrical reliability. It would further be desirable if such a package were smaller in size, lighter in weight and easier to manufacture than known prior art packages and did not rely upon glass seals to insulatively mount terminals through the walls of the package housing.

SUMMARY OF THE INVENTION

Generally speaking, the invention is a co-fired ceramic package for a power circuit and a method of manufacturing the same which offers improved thermal and mechanical performance over the prior art. The package of the invention comprises (1) a package base formed from a heat conductive, electrically insulative ceramic material such as beryllium oxide, aluminum nitride, or thermally enhanced silicon carbide, (2) a pattern of interconnected electrical conductors disposed both on top of and within said base, (3) a plurality of electrical components connected to the conductors for forming an electrical circuit which may generate heat, and (4) a cover mounted over the heat generating electrical circuit for hermetically sealing the circuit from the ambient atmosphere. To obviate the need for glass post seals, terminals in the form of conductive metallic pads are integrally provided within the ceramic base both within and without the cover of the package. These pads are electrically interconnected by means of conductive bridges which are disposed beneath the top surface the base where the cover is attached. Leads may be soldered to the outer pads to provide electrical connections to the power circuit disposed beneath the cover of the package.

In the method of the invention, the package is manufactured from a plurality of pyrolizable ceramic films, each of which includes a heat conductive ceramic material embedded within a binder. The steps of the invention comprise metalizing a top surface of at least one of the ceramic films by applying a pattern of fusible conductive material thereover, superposing the conductive-patterned ceramic film over at least one other film to form a stack, and laminating the resulting stack of ceramic films by pyrolysis which fuses together the ceramic material in the films to form a heat conductive and electrically insulative package base having a pattern of conductors that are accessible on the top side of the base. The method may further include the step of applying a ring of metallic sealing material around the pattern of conductive material on the top surface of the ceramic film prior to the lamination step. Thereafter, electrical components may be connected at junctions within the pattern of conductors which are formed by the fusing together of the conductive material when the stack is pyrolized. A cover may then be sealed around the resulting circuit by braising or soldering the edge of the cover to the ring of metallic sealing material in order to hermetically seal the resulting circuit.

In the preferred method of the invention, conductive connection pads are provided both within and without the location of the ring of metallic sealing material when the pattern of conductive material is applied to the top surface of the first ceramic film. Each pad is connected to a via that extends through at least the top two ceramic films. Conductive bridges are formed between each pair of inner and outer pads by applying a strip of conductive material on one of more of the ceramic films located beneath the top most film that contacts the via associated with each pad.

After co-firing has been completed and the necessary electrical components have been connected onto the resulting pattern of conductors, the pads form terminals that are connected to various junctions within the resulting circuit through the inner pads. The use of inner and outer pads which are interconnected by conductive bridges that are located beneath the top surface of the ceramic base obviates the need for glass post seals, and the resulting integrated, heat-conductive structure eliminates many metal-to-ceramic thermal interfaces. The resulting structure is not only superior in thermal dissipation and overall reliance; it also made in fewer steps than comparable prior art devices.

BRIEF DESCRIPTION OF THE SEVERAL FIGURES

DETAILED DESCRIPTION OF THE PREFERRED EMBODIMENT

Figure 1A:
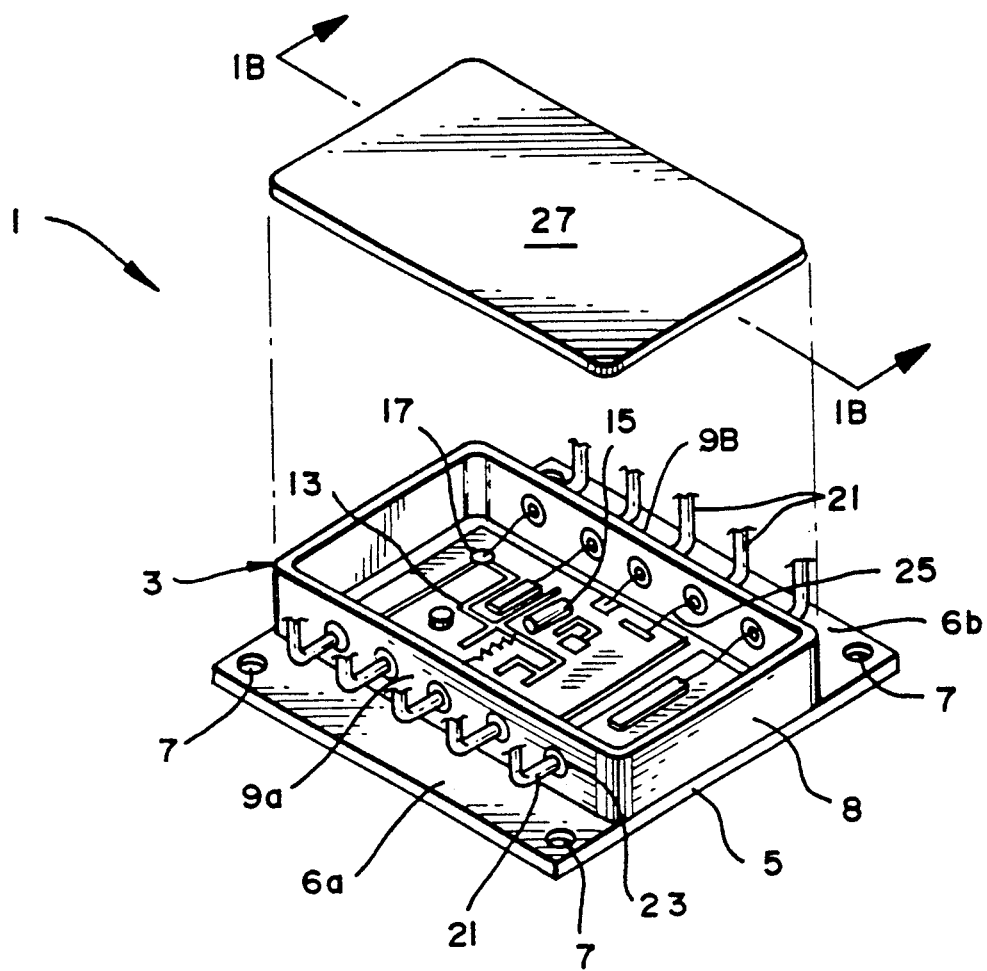
FIG. 1A is an exploded, perspective view of a prior art package for a power hybrid circuit.
Figure 1B:
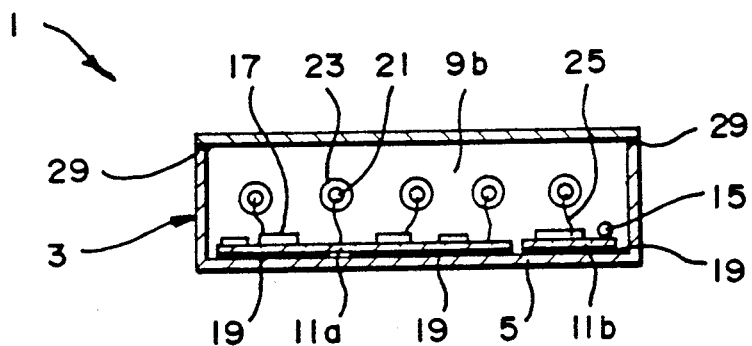
FIG. 1B is a cross-sectional side view of the package illustrated in FIG. 1A along the line 1B—1B.

The purpose of the invention is to provide a package for a hybrid power circuit that is superior in mechanical, thermal and electrical performance over the prior art package 1 illustrated in FIGS. 1A and 1B. This prior art package 1 includes a housing 3 formed from gold plated copper or a copper alloy. The bottom of the housing 3 includes a plate-like base 5 having opposing mounting flanges 6a, 6b. Holes 7 are disposed in the mounting flanges for attaching the package 1 to a heat-dissipating chassis. The housing 3 further includes a wall structure 8 having opposing side walls 9a, 9b which are integrally formed with the flat, plate-like base 5. One or more ceramic substrates 11a, 11b are mounted in the interior of the wall structure 8. Each of the substrates 11a, 11b may include a pattern 13 of conductors formed by known techniques of substrate metalization. Both discrete components 15 and integrated circuit components 17 are mounted onto the substrates 11a, 11b at various junctions within the conductor pattern 13 of each to form a hybrid circuit.

Each of the ceramic substrates 11 is mechanically mounted onto the top surface of the base 5 by solder junctions 19 formed from a lead-indium alloy. Additionally, terminal posts 21 are mounted in each of the opposing side walls 9a, 9b by insulative glass post seals 23. The purpose of the terminal post 21 is, of course, to provide electrical access to the hybrid circuit mounted onto the ceramic substrates 11a, 11b, and the inner ends of each of these posts 21 are connected to various junctions of the hybrid circuit by lead wires 25. To hermetically seal the hybrid circuit, a lid 27 is sealingly amounted around the upper edge of the wall structure 8 by solder ring 29.

While such prior art package 1 are capable of satisfactorily housing heat-generating hybrid circuits, the applicants have noted that the ceramic/solder/metallic base junction disadvantageously impairs the heat dissipation ability of such packages 1. Moreover, because the thermal expansion characteristics of the ceramic substrates 11a, 11b are typically different from the thermal expansion characteristics of the metal forming the base 5, significant thermal-mechanical stresses can arise at the solder junctions 19. While the ductility of the solder forming the junctions 19 can normally accommodate such stresses, the applicants have noted that these solders can become embrittled over time by the formation of gold-indium intermetallic compounds. If this occurs, the resulting embrittlement of the junctions 19, coupled with the previously described mechanical-thermal stresses can cause the ceramic substrates 11a, 11b to become detached from the base 5. Such detachment could in turn apply unacceptably high stresses to the delicate lead wires 25, which may in turn short out the hybrid circuit contained therein. Still another area where the package 1 can bear improvement is in the interface between the terminal post 21 and the opposing side walls 9. As previously pointed out, glass post seals 23 are used to insulate these posts 21 from the side walls 9a, 9b. However, the different thermal expansion characteristics of the glass forming the seals 23, and the metal forming the side walls 9 can cause the seals 23 to fail. Such failure can, in turn, cause the circuit to become exposed to the ambient atmosphere, and could possibly even result in breakage of one or more of the delicate lead wires 25 that interconnects the terminal post 1 to the hybrid circuit.

Figure 2:
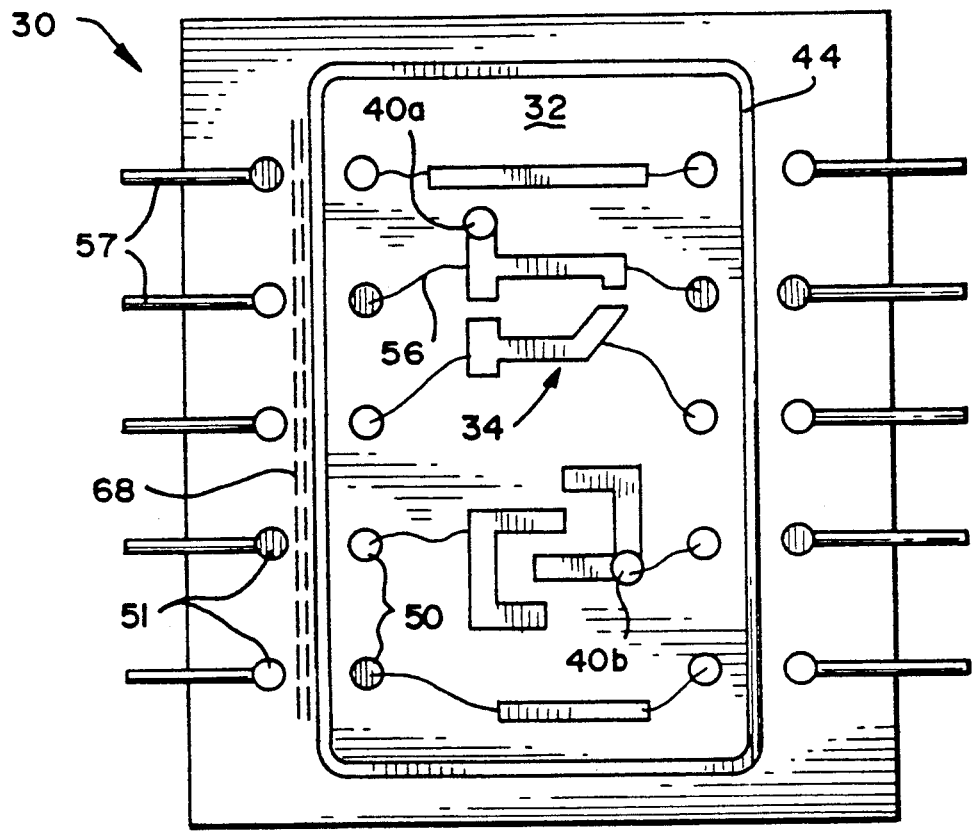
FIG. 2 is a plan view of the co-fired ceramic package of the invention with the cover removed so that the heat generating circuit housed by the package may be clearly seen.
Figure 3:
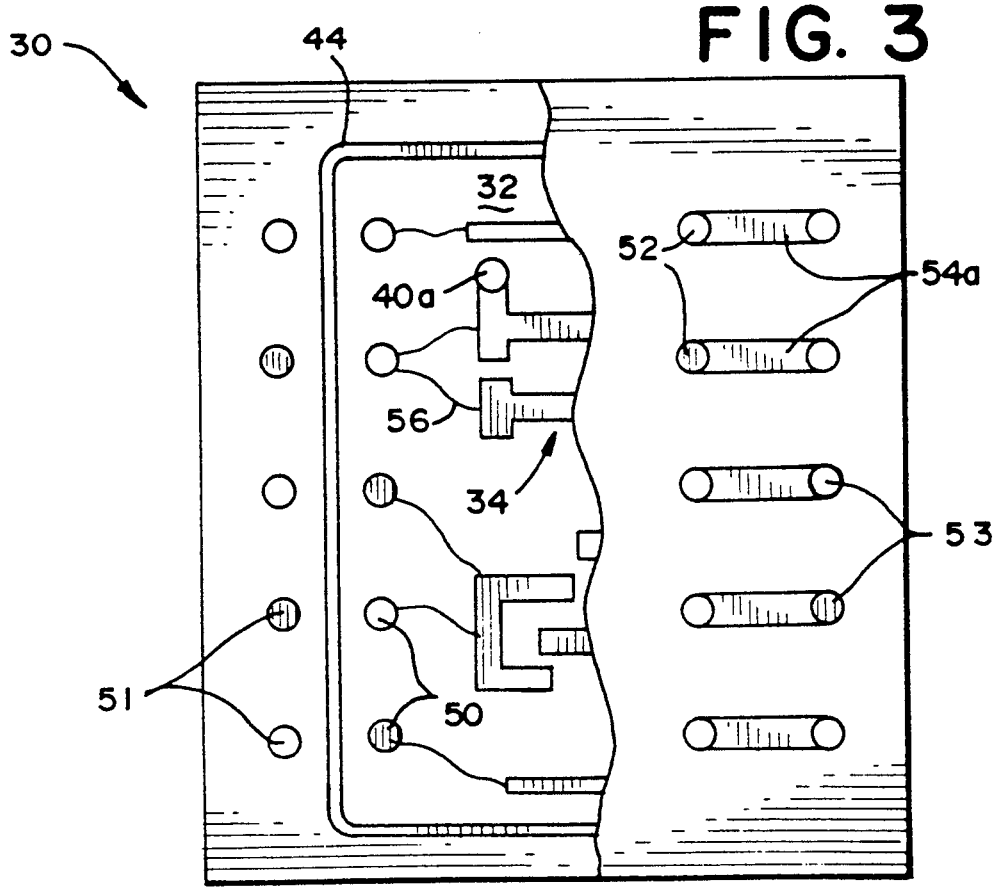
FIG. 3 is a partial cross-sectional plan view of the package illustrated in FIG. 2 illustrating the conductive bridges which are embedded within the base of the package and that interconnect the inner and outer terminal pads of the package.
Figure 4:
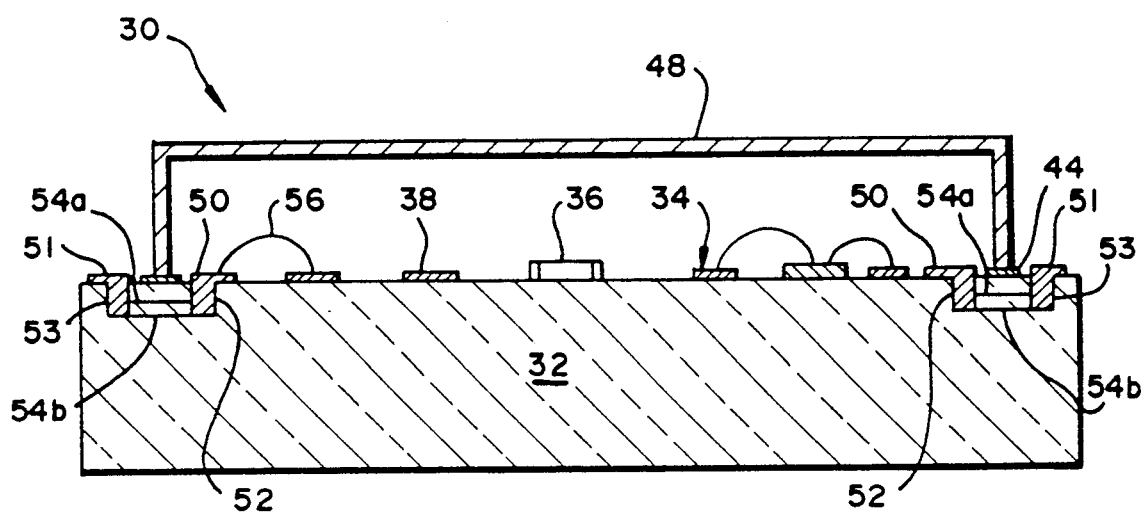
FIG. 4 is a cross-sectional side view of the co-fired ceramic package of the invention, illustrating the three-dimensional nature of the pattern of conductors used in the package as well as the subsurface location of the conductive bridges illustrated in FIG. 3.

With reference now to FIGS. 2, 3 and 4, the invention is a co-fired ceramic package 30 that offers improved performance over the prior art package 1 previously described. To this end, the package 30 of the invention includes a base 32 formed from an electrically insulative but thermally conductive ceramic material which may be aluminum nitride (AlN), silicon carbide (SiC), or beryllium oxide (BeO). Incorporated both in the interior and on the top surface of the base 32 is a three dimensional pattern 34 of conductors. On the top surface of the ceramic package base 32 an array of both discrete components 36 and integrated circuit components 38 is connected. Electrical through-holes in the form of vias 40a, 40b interconnect various levels of the three dimensional pattern 34 of conductors. In the preferred embodiment of the package 30, parallel conductors 42a, 42b are provided at different levels within the base 32 for carrying relatively heavy electrical loads within the hybrid circuit. The use of such parallel conductors 42a, 42b which are intimately mounted either on or within the thermally conductive base 32 advantageously increases the heat load that the package 30 can effectively dissipate. The ability to handle larger heat loads offering the option for further miniaturization of the heat-generating, hybrid circuit. This in turn could allow the package 30 to be made smaller and lighter, which are important advantages in airborne application of the package 30.

A solder seal ring 44 is provided around the pattern 34 of conductors present on the top surface of the base 32. This seal ring 44 allows the bottom edge 46 of a cover 48 to be braised or soldered in air tight relationship over the top surface of the base 32 in order to hermetically seal the hybrid circuit that it contains. In the preferred embodiment, the cover 48 is integrally formed from the same type of ceramic material which forms the package base 32 to avoid the generation of thermally induced, mechanical stresses caused by differences in the coefficient of expansion of the base 32 and cover 48. In the alternative, the cover 48 may be formed of copper or a copper alloy such as Kovar ®. The air within the cover 48 may be purged with an inert gas such a nitrogen prior to mounting it over the top surface of the base 32 so that the hybrid circuit is hermetically sealed in a non-corrosive atmosphere.

In lieu of the previously described terminal posts 21 and glass post seals 23 of the prior art, the package 30 of the invention is advantageously provided with a plurality of pairs of electrically connected and inner and outer terminal pads 50 and 52 disposed within and without the cover 48, respectively. Each of the inner and outer terminals pads 50 and 51 is electrically connected to a conductive via 52, 53 that penetrates through the top surface of the package base 32 in the manner illustrated in FIG. 4. Each pair of these vias 52,53 is in turn interconnected by at least two parallel conductive bridges 54a, 54b which may be conveniently formed from the same metalization that forms the three dimensional pattern 34 of conductors of the hybrid circuit. Like the previously described terminal posts 21, each pair of inner and outer terminal pads 50,51 provides electrical access to a junction within the three dimensional pattern 34 of conductors. Internal lead wires 55 connect each of the internal pads 50 to a particular junction in the pattern 34 of conductors, while external lead wires 57 connect each of the outer terminal pads 51 to another desired electrical assembly.

Figure 5:
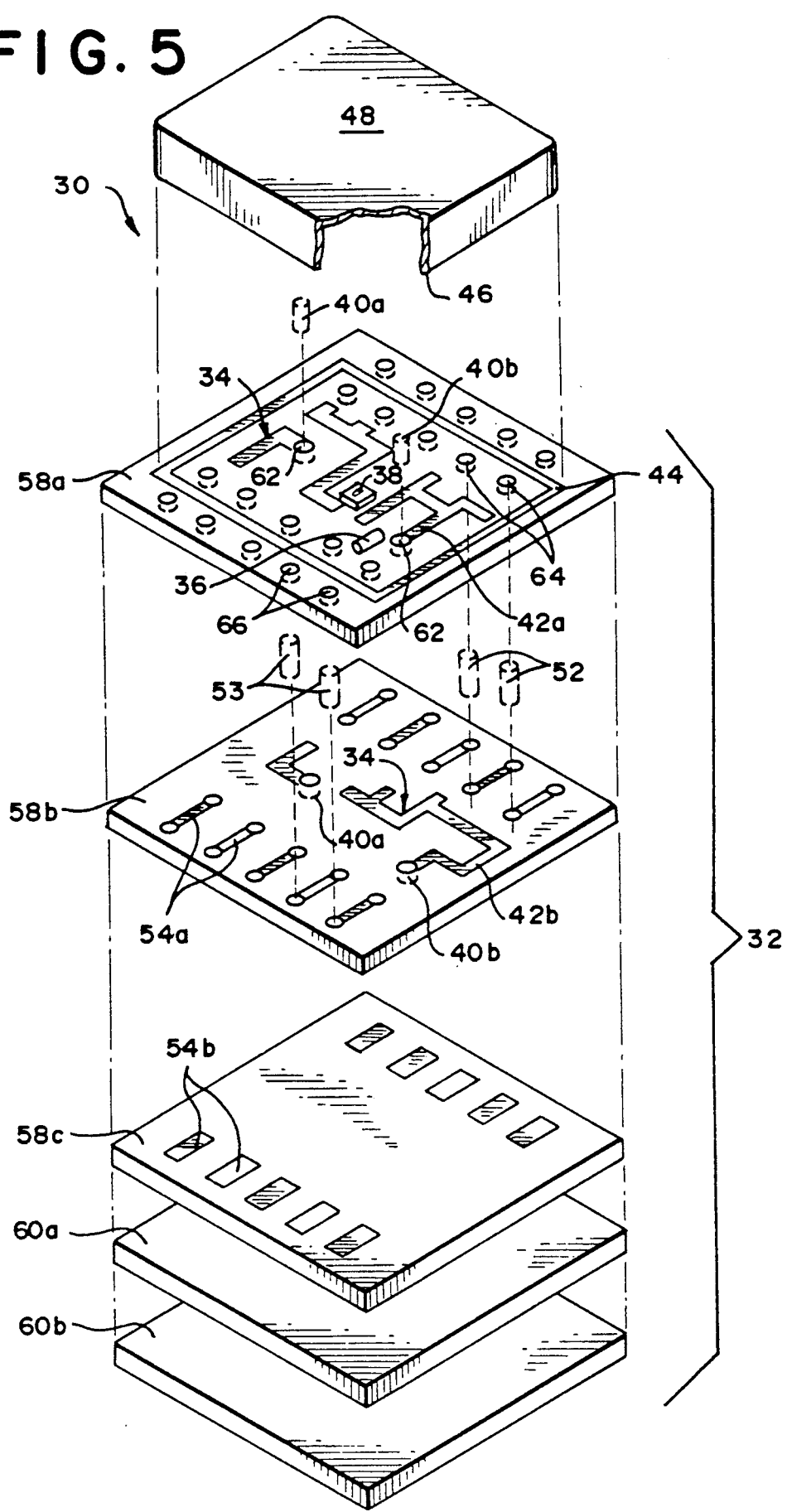
FIG. 5 is an exploded, perspective view of the ceramic tapes that are co-fired together to form the base of the package.

FIG. 5 illustrates the manner in which the base 32 of the co-fired ceramic package 30 of the invention is manufactured out of metalized ceramic tapes 58a,b,c which are stacked over and co-fired with rigidifying tapes 60a,b. At the outset, it should be noted that all of the ceramic apes 58a,b,c and 60a,b are formed from pyrolizable dielectric films that include particles of an electrically insulative but thermally conducting ceramic material such as aluminum nitride, silicon carbide or beryllium oxide which are suspended in a matrix of organic binding material. Such films or tapes containing either aluminum nitride or beryllium oxide are commercially available from the E. I. DuPont Company of Wilmington, Del. under the generic names of "green tape" or "ceramic tape". The applicants are not yet presently aware of any commercially available film or tape which incorporates particles of silicon nitride. However, particles of such silicon nitride are available from the Chemical Division of Hitachi Limited of Japan, and suitable organic binders for forming such films or tapes are again available from the E. I. DuPont Company.

In the first step of the method, through-holes 62, 64, and 66 are punched into ceramic tapes 58a,b. Next, all of the ceramic tapes 58a,b,c are metalized by printing a liquid compound onto the upper surfaces of the tapes in the shape of the desired circuit pattern 34. Such liquid compounds include fusible particles of a conductive metals suspended within an organic binder which, when pyrolyzed, fuse into conductive strips of metal on the tapes 58a,b,c. During this metalization step, the same liquid compound used to form the conductive pattern 34 is also used to print the conductive segments which will ultimately become the conductive bridges 54a,54b, as well as the solder seal ring 44 located on the upper surface of the ceramic tape 58a. At this same juncture, the holes 62, 64 and 66 are filled with a paste which, like the previously described metalization compound, contains particles of a fusible and conductive metal.

After all the metalization has been completed, the ceramic tapes 58a,b,c are stacked over regidifying ceramic tapes 60a,b. In the preferred embodiment, the metalized ceramic tapes 58a,b,c are only about 0.010 inches thick while the regidifying ceramic tapes 60a,b are on the order of 0.015 inches thick since their principal purpose is to strengthen the resulting base 32. During the stacking operation, the paste-filled holes 62, 64 and 66 located on the metalized ceramic tapes 58a,b are carefully placed into registry with one another. Next, the aggregate stack of ceramic tapes is co-fired, preferably at a temperature 900° C. and at a pressure which may be on the order of about 5,000 psi. Such co-firing volatilizes the organic binder material in the tapes, and causes the ceramic particles within them to fuse into a unitary, monolithic base 32. At the same time, the elevated temperature causes the metallic particles in the metalizing compound and paste used to fill the holes 62, 64 and 66 to form the conductive pattern 34 and the conductive vias 40a,b, 51 and 53.

Both the discrete and integrated components may now be connected directly on top of the ceramic base 32. At this time, internal lead wires 56 are also connected between the three dimensional pattern 34 of conductors and the internal terminal pads 50. The completion of these steps completes the formation of the hybrid circuit housed by the package 30. Either a ceramic or a metallic cover 48 may then be braised or soldered around the solder seal ring 44. This step is preferably formed in an atmosphere of an inert gas so that the hybrid circuit is hermetically sealed in a non-corrosive atmosphere.

Finally, external lead wires 57 are soldered or braised to the outer terminal pads 51. This is preferably performed by placing a lead frame 68 (partially shown in phantom in FIG. 2) around the cover 48 onto which the external lead wires 57 are mechanically connected. The spacing of the external lead wires 58 around the lead frame 68 corresponds to the spacing between the outer terminal pads 51 so that the frame 68 acts as a template that accurately positions each external lead wire over its respective outer terminal pad 51. After all of the external lead wires 58 are soldered in place, a cutting die (not shown) is used to sever the ends of each of the lead wires 58 from the frame 68 so that the frame 68 may be removed, thereby completing assembly of the co-fired ceramic package 30 of the invention.

We claim:

1. A package for a heat generating electrical circuit, comprising:
    a package base integrally formed from a heat conductive, electrically insulative ceramic material;
    a plurality of electrical components disposed on a top surface of said base for forming a heat generating electrical circuit;
    a pattern of interconnected electrical conductors disposed both on said top surface and within said ceramic material forming said base for forming a heat generating circuit by electrically interconnecting said components, wherein said pattern of conductors forms at least one parallel conductive path between said components from different conductors located at different levels within the base for more uniform dissipation of heat within said base;

a cover sealingly connected around the top surface of the package base and over said heat generating electrical circuit for hermetically sealing said circuit from the ambient atmosphere.

and terminal means for providing electrical access to said heat generating circuit.

2. A package for a heat generating electrical circuit as defined in claim 1, wherein said base is formed from one of the group consisting of beryllium oxide, aluminum nitride, and silicon carbide.

3. A package for a heat generating electrical circuit as defined in claim 1, wherein the thermal coefficient of said cover is substantially the same as the ceramic material forming said base.

4. A package for a heat generating electrical circuit as defined in claim 1, further including an inert gas atmosphere within said cover for protecting said electrical components from corrosion.

5. A package for a heat generating electrical circuit as defined in claim 1, further including inner and outer conductive pads on said top surface of said base both within and without said cover, respectively, wherein said inner pads are connected to said pattern of electrical conductors and said outer pads provide electrical terminals for said circuit.

6. A package for a heat generating electrical circuit, comprising:
   a package base integrally formed from a heat conductive, electrically insulative ceramic material;
   a plurality of electrical components disposed on a top surface of said base for forming a heat generating electrical circuit;
   a cover sealingly connected around the top surface of the package base and over said heat generating electrical circuit for hermetically sealing said circuit from the ambient atmosphere;
   a pattern of interconnected electrical conductors disposed both on said top surface and within said ceramic material forming said base for forming a heat generating circuit by electrically interconnecting said components, wherein said pattern of conductors form at least one parallel conductive path between said components from different conductors located at different levels within said base for more uniform dissipation of heat within said base, and
   terminal means integrally provided through the ceramic material forming said package base for providing electrical access to said heat generating circuit.

7. A package for a heat generating electrical circuit, comprising:
   a package base formed from a heat conductive, electrically insulative ceramic material;
   a pattern of interconnected electrical conductors disposed both on a top surface of said base and within said base;
   a plurality of electrical components connected to said conductors disposed on said top surface of said base for forming a heat generating electrical circuit;
   a cover sealingly connected around the top surface of the package base and over said heat generating electrical circuit for hermetically sealing said circuit from the ambient atmosphere, and
   conductive pads on said top surface of said base both within and without said cover wherein said inner pads are connected to said pattern of electrical conductors and said outer pads provide electrical terminals for said circuit, said inner and outer pads being interconnected by conductive bridges being disposed within said base beneath the top surface thereof in the vicinity of the edge of said cover to avoid electrical contact with said lid.

* * * * *